(12) United States Patent
Shen et al.

(10) Patent No.: US 11,380,877 B2
(45) Date of Patent: Jul. 5, 2022

(54) ORGANIC LIGHT EMITTING DEVICE AND ORGANIC LIGHT EMITTING DISPLAY DEVICE COMPRISING A POLARIZING LAYER HAVING A FIRST INORGANIC LAYER, A FIRST POLARIZING LAYER, A SECOND INORGANIC LAYER, AND A SECOND POLARIZING LAYER, WHICH ARE SEQUENTIALLY DISPOSED

(71) Applicant: WUHAN CHINA STAR OPTOELECTRONICS SEMICONDUCTOR DISPLAY TECHNOLOGY CO., LTD, Hubei (CN)

(72) Inventors: Jiulin Shen, Hubei (CN); Guochun Yan, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 263 days.

(21) Appl. No.: 16/615,858

(22) PCT Filed: Aug. 22, 2019

(86) PCT No.: PCT/CN2019/101954
§ 371 (c)(1),
(2) Date: Nov. 22, 2019

(87) PCT Pub. No.: WO2021/012343
PCT Pub. Date: Jan. 28, 2021

(65) Prior Publication Data
US 2021/0336233 A1 Oct. 28, 2021

(30) Foreign Application Priority Data

Jul. 25, 2019 (CN) .......................... 201910675996.9

(51) Int. Cl.
*H01L 51/52* (2006.01)
*H01L 27/32* (2006.01)

(52) U.S. Cl.
CPC ...... *H01L 51/5293* (2013.01); *H01L 27/3246* (2013.01)

(58) Field of Classification Search
CPC combination set(s) only.
See application file for complete search history.

(56) References Cited

U.S. PATENT DOCUMENTS

| 2011/0175123 A1* | 7/2011 | Koh | H01L 51/5293 257/E51.019 |
| 2014/0312339 A1* | 10/2014 | Fujita | H01L 27/322 257/40 |

(Continued)

*Primary Examiner* — Nduka E Ojeh

(57) ABSTRACT

An organic light emitting device includes a substrate layer, an anode disposed on the substrate layer, a pixel defining layer disposed on the anode and including bumps and openings spaced apart from each other, a light emitting functional layer disposed on the pixel defining layer, a polarizing layer disposed on the light emitting functional layer, and an encapsulation layer disposed on the polarizing layer for encapsulating the polarizing layer and the light emitting functional layer. The polarizing layer including a first inorganic layer, a first polarizing layer, a second inorganic layer, and a second polarizing layer, which are sequentially disposed. The first inorganic layer is disposed on the light emitting functional layer and the pixel defining layer, and the first polarizing layer and the second polarizing layer are disposed corresponding to the openings.

18 Claims, 7 Drawing Sheets

(56) References Cited

U.S. PATENT DOCUMENTS

2016/0155787 A1\* 6/2016 Lee .................... H01L 27/3258
　　　　　　　　　　　　　　　　　　　257/72
2017/0294565 A1\* 10/2017 Kim .................... H01L 25/0753

\* cited by examiner

ORGANIC LIGHT EMITTING DEVICE AND ORGANIC LIGHT EMITTING DISPLAY DEVICE COMPRISING A POLARIZING LAYER HAVING A FIRST INORGANIC LAYER, A FIRST POLARIZING LAYER, A SECOND INORGANIC LAYER, AND A SECOND POLARIZING LAYER, WHICH ARE SEQUENTIALLY DISPOSED

CROSS-REFERENCE TO RELATED APPLICATIONS

This application is a 371 U.S. National Stage of International Application No. PCT/CN2019/101954, filed on Aug. 22, 2019, which claims priority to Chinese Application No. 201910675996.9, filed on Jul. 25, 2019. The entire disclosures of the above applications are incorporated herein by reference.

FIELD OF INVENTION

The present disclosure relates to the field of display technologies, and more particularly to an organic light emitting device and an organic light emitting display device.

BACKGROUND OF INVENTION

Current organic light emitting display devices include functional film layers such as a polarizer, an external touch module, a cover plate, a back plate, and a foam. An overall thickness of a non-bent organic light emitting display device ranges between 1000 μm and 1500 μm, and the overall thickness thereof is large. A bendable organic light emitting display device has an overall thickness of about 500 μm and the overall thickness thereof is large and is not advantageous for bending.

Therefore, there is a need to provide an organic light emitting device, a method of fabricating the same, and an organic light emitting display device to solve issues of the prior art.

SUMMARY OF INVENTION

In order to solve the above technical problems, an object of an embodiment of the present disclosure is to provide an organic light emitting device and an organic light emitting display device, which can realize a built-in polarization function of the organic light emitting device, reduce a thickness of the organic light emitting device, and facilitate bending of the organic light emitting device.

To achieve the above object, an embodiment of the present disclosure provides an organic light emitting device. The organic light emitting device includes a substrate layer, an anode, a pixel defining layer, a light emitting functional layer, a polarizing layer, and an encapsulation layer. The anode is disposed on the substrate layer. The pixel defining layer is disposed on the anode and includes bumps and openings spaced apart from each other, and the openings expose the anode. The light emitting functional layer is disposed on the pixel defining layer. The polarizing layer is disposed on the light emitting functional layer, and at least a portion of the polarizing layer is disposed within the openings. The encapsulation layer is disposed on the polarizing layer for encapsulating the polarizing layer and the light emitting functional layer.

In an embodiment of the present disclosure, the polarizing layer includes a first inorganic layer, a first polarizing layer, a second inorganic layer, and a second polarizing layer, which are sequentially disposed, the first inorganic layer is disposed on the light emitting functional layer and the pixel defining layer, and the first polarizing layer and the second polarizing layer are disposed corresponding to the openings.

In an embodiment of the present disclosure, the first polarizing layer is disposed in the openings, and the second inorganic layer is coated on the first polarizing layer and the first inorganic layer.

In an embodiment of the present disclosure, the first polarizing layer is a circularly polarizing layer, and the second polarizing layer is a linearly polarizing layer.

In an embodiment of the present disclosure, the light emitting functional layer includes an organic light emitting layer and a cathode disposed on the anode, the cathode is coated on the organic light emitting layer and the bumps of the pixel defining layer, and the first inorganic layer completely covers the cathode.

In an embodiment of the present disclosure, the organic light emitting device further includes spacers disposed on the bumps, and the first inorganic layer is disposed on the spacers.

In an embodiment of the present disclosure, a sum of a thickness of the pixel defining layer and a thickness of each of the spacers is greater than or equal to a sum of a thickness of the anode, a thickness of the light emitting functional layer, a thickness of the first polarizing layer, and a thickness of the second polarizing layer.

In an embodiment of the present disclosure, a projection of the first polarizing layer on the anode and a projection of the second polarizing layer on the anode partially coincide.

In an embodiment of the present disclosure, the first polarizing layer and the second polarizing layer have shapes of an inverted trapezoid having an upper width and a lower width, or the shape of the first polarizing layer is the inverted trapezoid having the upper width and the lower width, and the shape of the second polarizing layer is a polygon having an upper width and a lower width.

In an embodiment of the present disclosure, the first polarizing layer is a first light alignment liquid crystal layer, and the second polarizing layer is a second light alignment liquid crystal layer comprising a dye.

In an embodiment of the present disclosure, an inner angle of a bottom edge of each of the spacers is less than or equal to an inner angle of a bottom edge of the pixel defining layer.

An embodiment of the present disclosure further provides an organic light emitting display device. The organic light emitting display device includes an organic light emitting device and a cover plate disposed on the organic light emitting device. The organic light emitting device includes a substrate layer, an anode, a pixel defining layer, a light emitting functional layer, a polarizing layer, and an encapsulation layer. The anode is disposed on the substrate layer. The pixel defining layer is disposed on the anode and includes bumps and openings spaced apart from each other, and the openings expose the anode. The light emitting functional layer is disposed on the pixel defining layer. The polarizing layer is disposed on the light emitting functional layer, and at least a portion of the polarizing layer is disposed within the openings. The encapsulation layer is disposed on the polarizing layer for encapsulating the polarizing layer and the light emitting functional layer.

In an embodiment of the present disclosure, the polarizing layer includes a first inorganic layer, a first polarizing layer, a second inorganic layer, and a second polarizing layer, which are sequentially disposed, the first inorganic layer is disposed on the light emitting functional layer and the pixel defining layer, and the first polarizing layer and the second polarizing layer are disposed corresponding to the openings.

In an embodiment of the present disclosure, the first polarizing layer is disposed in the openings, and the second inorganic layer is coated on the first polarizing layer and the first inorganic layer.

In an embodiment of the present disclosure, the first polarizing layer is a circularly polarizing layer, and the second polarizing layer is a linearly polarizing layer.

In an embodiment of the present disclosure, the light emitting functional layer includes an organic light emitting layer and a cathode disposed on the anode, the cathode is coated on the organic light emitting layer and the bumps of the pixel defining layer, and the first inorganic layer completely covers the cathode.

In an embodiment of the present disclosure, the organic light emitting device further includes spacers disposed on the bumps, and the first inorganic layer is disposed on the spacers.

In an embodiment of the present disclosure, a sum of a thickness of the pixel defining layer and a thickness of each of the spacers is greater than or equal to a sum of a thickness of the anode, a thickness of the light emitting functional layer, a thickness of the first polarizing layer, and a thickness of the second polarizing layer.

In an embodiment of the present disclosure, a projection of the first polarizing layer on the anode and a projection of the second polarizing layer on the anode partially coincide.

In an embodiment of the present disclosure, the first polarizing layer and the second polarizing layer have shapes of an inverted trapezoid having an upper width and a lower width, or the shape of the first polarizing layer is the inverted trapezoid having the upper width and the lower width, and the shape of the second polarizing layer is a polygon having an upper width and a lower width.

Beneficial effects of an embodiment of the present disclosure are that, the polarizing layer in the embodiment of the present disclosure is disposed on the light emitting functional layer, and the encapsulating layer is disposed on the polarizing layer for encapsulating the polarizing layer and the light emitting functional layer to implement built-in polarization function of the organic light emitting device, reduce the thickness of the organic light emitting device, and facilitate bending of the organic light emitting device.

DETAILED DESCRIPTION OF PREFERRED EMBODIMENTS

Figure 1:
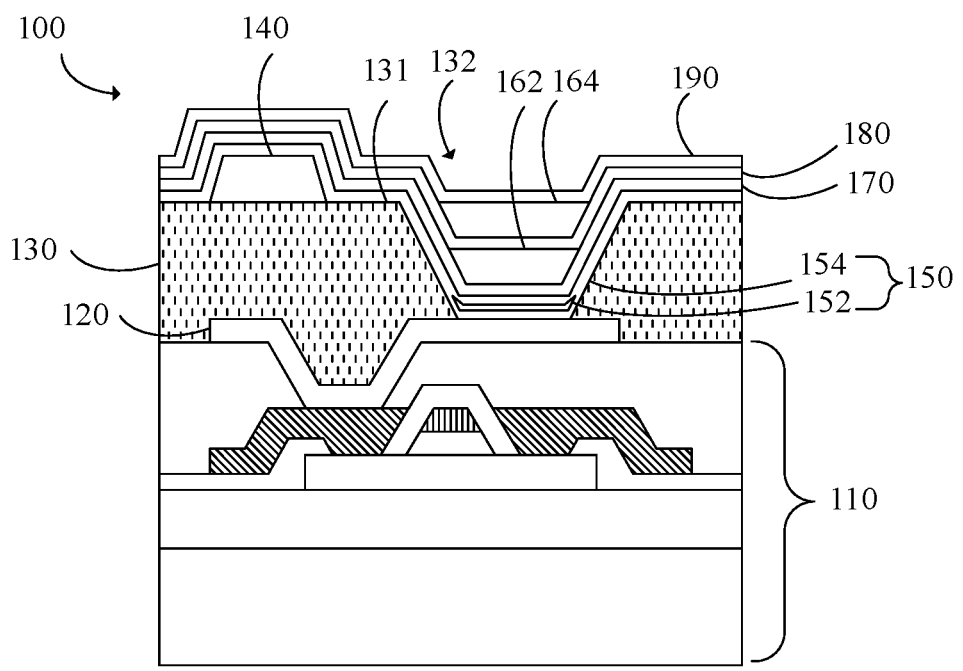
FIG. 1 is a schematic structural view of an organic light emitting device according to an embodiment of the present invention.

The following description of the various embodiments is provided to illustrate the specific embodiments by referring to the accompanying drawings.

The above and other objects, features, and advantages of the present disclosure will be more apparent and obvious. Hereinafter, the preferred embodiments of the present disclosure will be described in detail with reference to the accompanying drawings. In addition, directional terms described by the present disclosure, such as up, down, top, bottom, front, back, left, right, inner, outer, side, surrounding, central, level, horizontal, vertical, perpendicular, axial, radial, uppermost, lowermost, etc., are only directions by referring to the accompanying drawings, and thus the used terms are used only for the purpose of describing embodiments of the present disclosure and are not intended to be limiting of the present disclosure.

In the drawings, units with similar structures are labeled with the same reference number.

Referring to FIG. 1, an embodiment of the present invention provides a schematic structural view of an organic light emitting device. An organic light emitting device 100 of an embodiment of the present invention includes a substrate layer 110, an anode 120, a pixel defining layer 130, a light emitting functional layer 150, a polarizing layer, and an encapsulation layer 190. The anode 120 is disposed on the substrate layer 110. The pixel defining layer 130 is disposed on the anode 120, and the pixel defining layer 130 includes bumps 131 and openings 132 spaced apart from each other. The openings 132 expose the anode 120. The light emitting functional layer 150 is disposed on the pixel defining layer 130. The polarizing layer is disposed on the light emitting function layer 150, and at least a portion of the polarizing layer is disposed in the openings 132. The encapsulating layer 190 is disposed on the polarizing layer for encapsulating the polarizing layer and the light emitting functional layer 150 to implement built-in polarization function of the organic light emitting device 100, reduce the thickness of the organic light emitting device 100, and facilitate bending of the organic light emitting device 100.

In details, in an embodiment of the present disclosure, the polarizing layer includes a first inorganic layer 170, a first polarizing layer 162, a second inorganic layer 180, and a second polarizing layer 164, which are sequentially disposed, the first inorganic layer 170 is disposed on the light emitting functional layer 150 and the pixel defining layer 130, and the first polarizing layer 162 and the second polarizing layer 164 are disposed corresponding to the openings 132. The first polarizing layer 162 is disposed in the openings 132, and the second inorganic layer 180 is coated on the first polarizing layer 162 and the first inorganic layer 170. In an embodiment of the present disclosure, the first polarizing layer 162 is a circularly polarizing layer, and the second polarizing layer 164 is a linearly polarizing layer.

In details, in an embodiment of the present disclosure, the light emitting functional layer 150 includes an organic light emitting layer 152 and a cathode 154 disposed on the anode 120, the cathode 154 is coated on the organic light emitting layer 152 and the bumps 131 of the pixel defining layer 130, and the first inorganic layer 170 completely covers the cathode 154.

In details, in an embodiment of the present disclosure, the organic light emitting device 100 further includes spacers 140 disposed on the bumps 131, and the first inorganic layer 170 is disposed on the spacers 140. In an embodiment of the present disclosure, a sum of a thickness of the pixel defining layer 130 and a thickness of each of the spacers 140 is greater than or equal to a sum of a thickness of the anode 120, a thickness of the light emitting functional layer 150, a thickness of the first polarizing layer 162, and a thickness of the second polarizing layer 164.

In details, in an embodiment of the present disclosure, a projection of the first polarizing layer 162 on the anode 120 and a projection of the second polarizing layer 164 on the anode 120 partially coincide. The first polarizing layer 162 and the second polarizing layer 164 have shapes of an inverted trapezoid having an upper width and a lower width. In an embodiment of the present disclosure, the first polarizing layer 162 is a first light alignment liquid crystal layer, and the second polarizing layer 164 is a second light alignment liquid crystal layer comprising a dye. Specifically, in an embodiment of the present invention, a projected area of the first polarizing layer 162 on the anode 120 is different from a projected area of the second polarizing layer 164 on the anode 120. A projection area of the first polarizing layer 162 on the anode 120 is less than a projection area of the second polarizing layer 164 on the anode 120.

Specifically, in an embodiment of the present invention, materials of the first inorganic layer 170 and the second inorganic layer 180 include, for example, SiNx, SiOx, or SiONx. The first inorganic layer 170 and the second inorganic layer 180 may also be other transparent inorganic layers, and the material includes, for example, alumina or the like. Thicknesses of the first inorganic layer 170 and the second inorganic layer 180 range between 0.1 μm and 1 μm. The encapsulation layer 190 may be an inorganic layer. The encapsulation layer 190 may be a three-layer or multi-layer structure. The first polarizing layer 162 and the second polarizing layer 164 have a thickness ranging between 0.3 μm and 3 μm.

In an embodiment of the present invention, the organic light emitting layer 152 is disposed in the openings 132 of the pixel defining layer 130. The first light emitting functional layer 152 is, for example, a red light emitting layer, a green light emitting layer, or a blue light emitting layer.

In an embodiment of the present invention, the pixel defining layer 130 has a thickness ranging between 4 μm and 10 μm.

Referring to FIG. 1, in an embodiment of the present invention, the organic light emitting device 100 is, for example, a top emitting organic light emitting device. In an embodiment, the organic light emitting device 100 in which the polarization function is built-in is realized by thickening the thickness of the pixel defining layer 130 to 4 to 10 μm. Thus, the two polarizing layers (i.e., the first polarizing layer 162 and the second polarizing layer 164) are placed inside the pixel, and after the alignment, the polarization function is realized.

Figure 2:
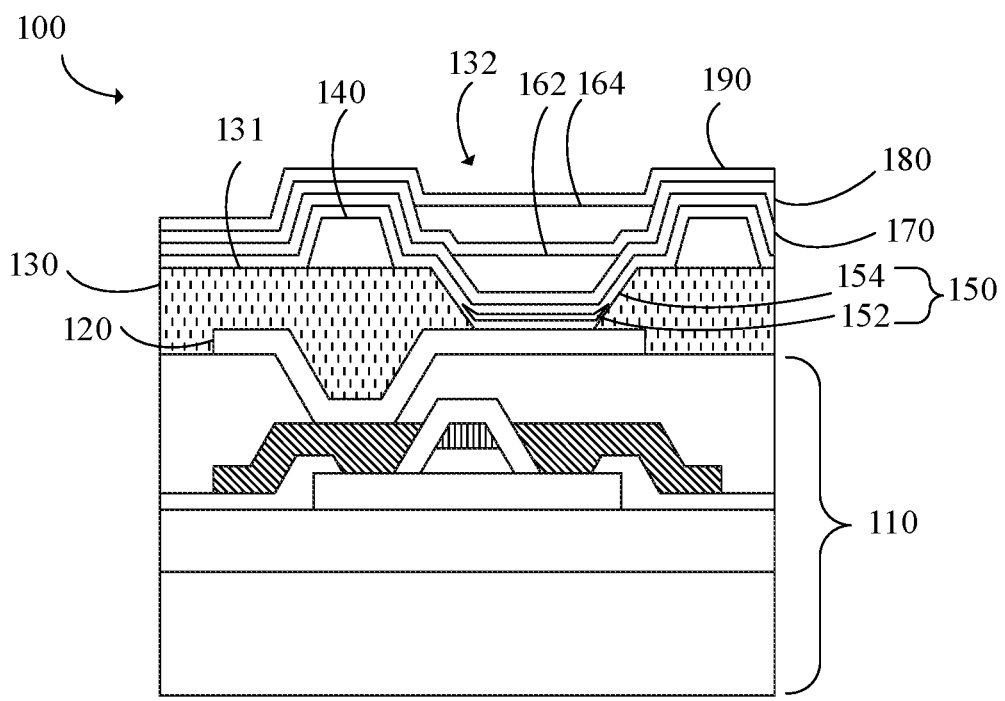
FIG. 2 is a schematic structural view of an organic light emitting device according to an embodiment of the present invention.

Referring to FIG. 2, an embodiment of the present invention provides a schematic structural view of an organic light emitting device. An organic light emitting device 100 of an embodiment of the present invention includes a substrate layer 110, an anode 120, a pixel defining layer 130, a light emitting functional layer 150, a polarizing layer, and an encapsulation layer 190. The anode 120 is disposed on the substrate layer 110. The pixel defining layer 130 is disposed on the anode 120, and the pixel defining layer 130 includes bumps 131 and openings 132 spaced apart from each other. The openings 132 expose the anode 120. The light emitting functional layer 150 is disposed on the pixel defining layer 130. The polarizing layer is disposed on the light emitting function layer 150, and at least a portion of the polarizing layer is disposed in the openings 132. The encapsulating layer 190 is disposed on the polarizing layer for encapsulating the polarizing layer and the light emitting functional layer 150 to implement built-in polarization function of the organic light emitting device 100, reduce the thickness of the organic light emitting device 100, and facilitate bending of the organic light emitting device 100.

In details, in an embodiment of the present disclosure, the polarizing layer includes a first inorganic layer 170, a first polarizing layer 162, a second inorganic layer 180, and a second polarizing layer 164, which are sequentially disposed, the first inorganic layer 170 is disposed on the light emitting functional layer 150 and the pixel defining layer 130, and the first polarizing layer 162 and the second polarizing layer 164 are disposed corresponding to the openings 132. The first polarizing layer 162 is disposed in the openings 132, and the second inorganic layer 180 is coated on the first polarizing layer 162 and the first inorganic layer 170. In an embodiment of the present disclosure, the first polarizing layer 162 is a circularly polarizing layer, and the second polarizing layer 164 is a linearly polarizing layer.

In details, in an embodiment of the present disclosure, the light emitting functional layer 150 includes an organic light emitting layer 152 and a cathode 154 disposed on the anode 120, the cathode 154 is coated on the organic light emitting layer 152 and the bumps 131 of the pixel defining layer 130, and the first inorganic layer 170 completely covers the cathode 154.

In details, in an embodiment of the present disclosure, the organic light emitting device 100 further includes spacers 140 disposed on the bumps 131, and the first inorganic layer 170 is disposed on the spacers 140. In an embodiment of the present disclosure, a sum of a thickness of the pixel defining layer 130 and a thickness of each of the spacers 140 is greater than or equal to a sum of a thickness of the anode 120, a thickness of the light emitting functional layer 150, a thickness of the first polarizing layer 162, and a thickness of the second polarizing layer 164. An inner angle of a bottom edge of each of the spacers 140 is less than or equal to an inner angle of a bottom edge of the pixel defining layer 130.

Specifically, in an embodiment of the present invention, a projected area of the first polarizing layer 162 on the anode 120 is different from a projected area of the second polarizing layer 164 on the anode 120. A projection area of the first polarizing layer 162 on the anode 120 is less than a projection area of the second polarizing layer 164 on the anode 120.

In details, in an embodiment of the present disclosure, a projection of the first polarizing layer 162 on the anode 120 and a projection of the second polarizing layer 164 on the anode 120 partially coincide. The shape of the first polarizing layer 162 is an inverted trapezoid having an upper width and a lower width, and the shape of the second polarizing layer 164 is a polygon having an upper width and a lower width. Specifically, sides of the polygon are composed of a plurality of line segments of different directions. In an embodiment of the present disclosure, the first polarizing layer 162 is a first light alignment liquid crystal layer, and the second polarizing layer 164 is a second light alignment liquid crystal layer comprising a dye. Specifically, in an embodiment of the present invention, materials of the first inorganic layer 170 and the second inorganic layer 180 include, for example, SiNx, SiOx, or SiONx. The first inorganic layer 170 and the second inorganic layer 180 may also be other transparent inorganic layers, and the material includes, for example, alumina or the like. Thicknesses of the first inorganic layer 170 and the second inorganic layer 180 range between 0.1 µm and 1 µm. The encapsulation layer 190 may be an inorganic layer. The encapsulation layer 190 may be a three-layer or multi-layer structure. The first polarizing layer 162 and the second polarizing layer 164 have a thickness ranging between 0.3 µm and 3 µm.

In an embodiment of the present invention, the organic light emitting layer 152 is disposed in the openings 132 of the pixel defining layer 130. The first light emitting functional layer 152 is, for example, a red light emitting layer, a green light emitting layer, or a blue light emitting layer.

In an embodiment of the present invention, the pixel defining layer 130 has a thickness ranging between 4 µm and 10 µm, and/or each of the spacers has a thickness ranging between 1.5 µm and 10 µm.

Referring to FIG. 2, in an embodiment of the present invention, the organic light emitting device 100 is, for example, a top emitting organic light emitting device. In an embodiment, the organic light emitting device 100 in which the polarization function is built-in is realized by thickening the thickness of the pixel defining layer 130 to 4 to 10 µm. Thus, the two polarizing layers (i.e., the first polarizing layer 162 and the second polarizing layer 164) are placed inside the pixel, and after the alignment, the polarization function is realized.

Figure 3:
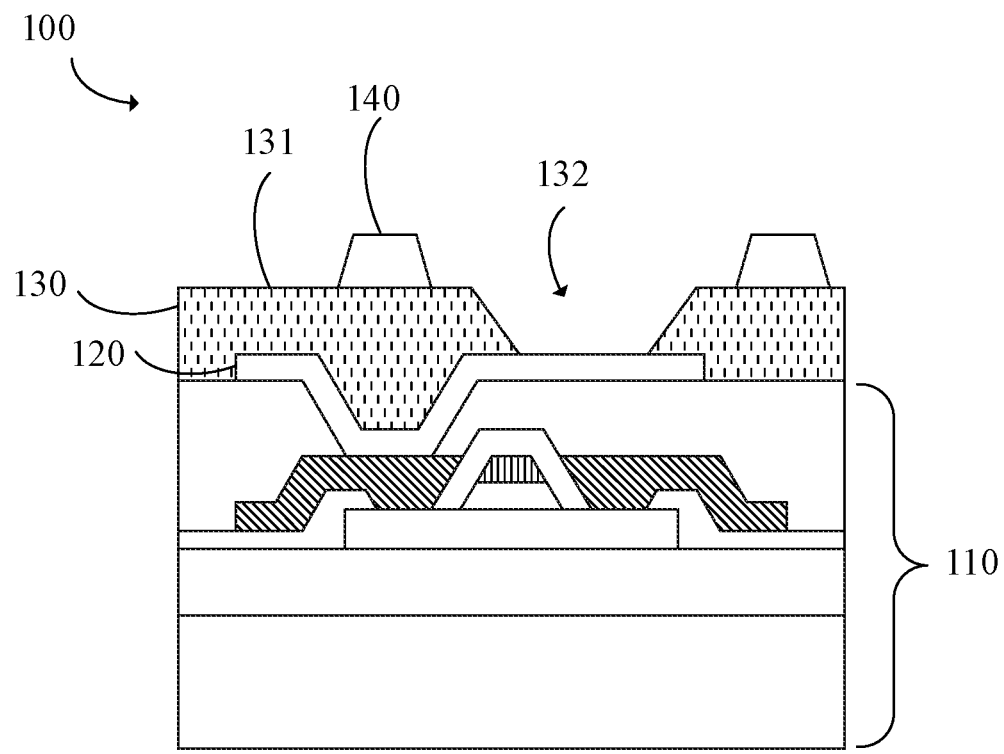
FIG. 3 is a schematic cross-sectional view of a spacer of an organic light emitting device according to an embodiment of the present invention.
Figure 4:
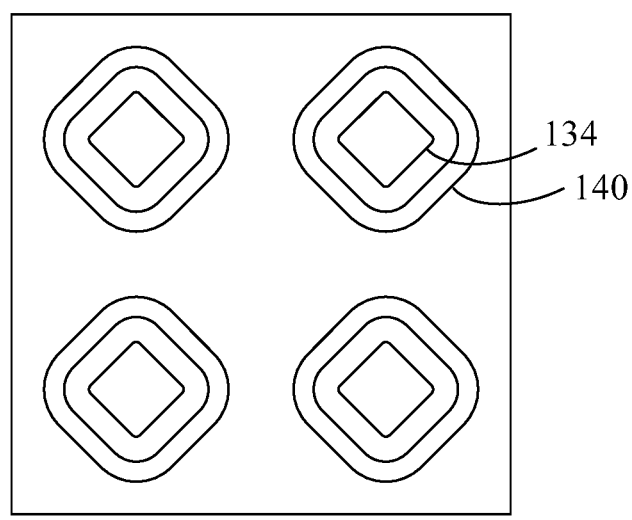
FIG. 4 is a plan view illustrating a spacer of an organic light emitting device according to an embodiment of the present invention.
Figure 5:
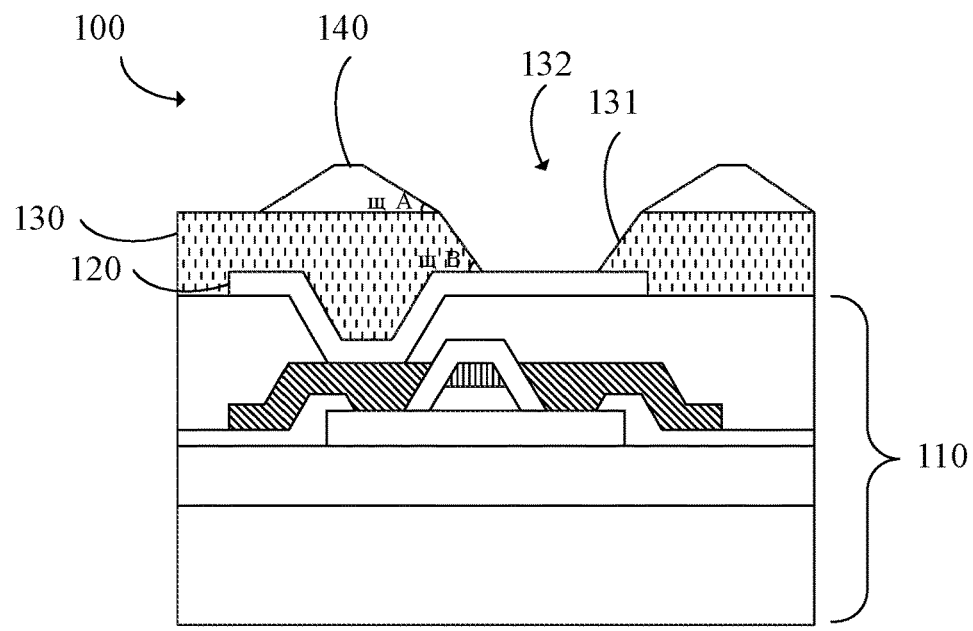
FIG. 5 is a cross-sectional view illustrating a spacer of an organic light emitting device according to an embodiment of the present invention.

Referring to FIG. 3 to FIG. 5, in an embodiment of the present invention, shape and position of the spacers 140 have various designs. In an embodiment of the present invention, each of the spacers 140 has a shape of a crater (FIG. 4) or a trapezoidal column (FIGS. 3 and 4), and the spacers 140 surround the openings 132 of the pixel defining layer 130.

In an embodiment of the present invention, a bottom edge of each of the spacers 140 is adjacent to a top edge of the pixel defining layer 130 (FIG. 4) or is not adjacent to the top edge of the pixel defining layer 130 (FIG. 3). Referring to FIG. 4, in an embodiment of the present invention, when the bottom edge of each of the spacers 140 is in contact with the top edge of the pixel defining layer 130, an inner corner ∠A of the bottom edge of each of the spacers 140 is less than or equal to an inner corner ∠B of the bottom edge of the pixel defining layer 130. The bottom edge of each of the spacers 140 and the bottom edge of the pixel defining layer 130 are disposed on the same side, so that the organic light emitting device 100 has good light extraction efficiency.

Referring to FIGS. 3 and 4, in an embodiment of the present invention, each of the spacers 140 has a shape similar to a crater shape and surrounds the pixels 134. Each of the spacers 140 encloses exactly one pixel 134 or slightly more than one pixel 134. The thickness of each of the spacers may be thickened between 1.5 µm and 10 µm. In an embodiment of the present invention, it is not limited to the arrangement state of the pixels 134 of FIG. 4. Referring to FIG. 5, in an embodiment of the present invention, each of the spacers 140 is shaped like a trapezoidal column, and each of the spacers 140 encloses one pixel 134.

Figure 6:
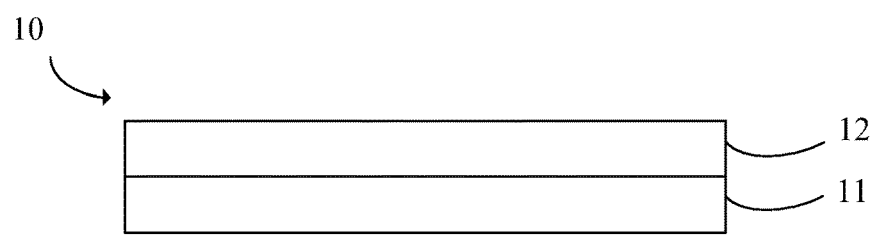
FIG. 6 is a schematic structural view of an organic light emitting display device according to an embodiment of the present invention.

Referring to FIG. 6, an organic light emitting display device 10 is further provided in an embodiment of the present invention. The organic light emitting display device 10 includes the organic light emitting device 100 as described above and a cover plate 12 disposed on the organic light emitting device 100. The organic light emitting display device 10 includes a built-in touch display panel 11. The built-in touch display panel 11 includes the organic light emitting device 100 as described above. The cover plate 12 is, for example, a hard coating layer. The hard coat layer is disposed on the built-in touch display panel 11.

Figure 7:
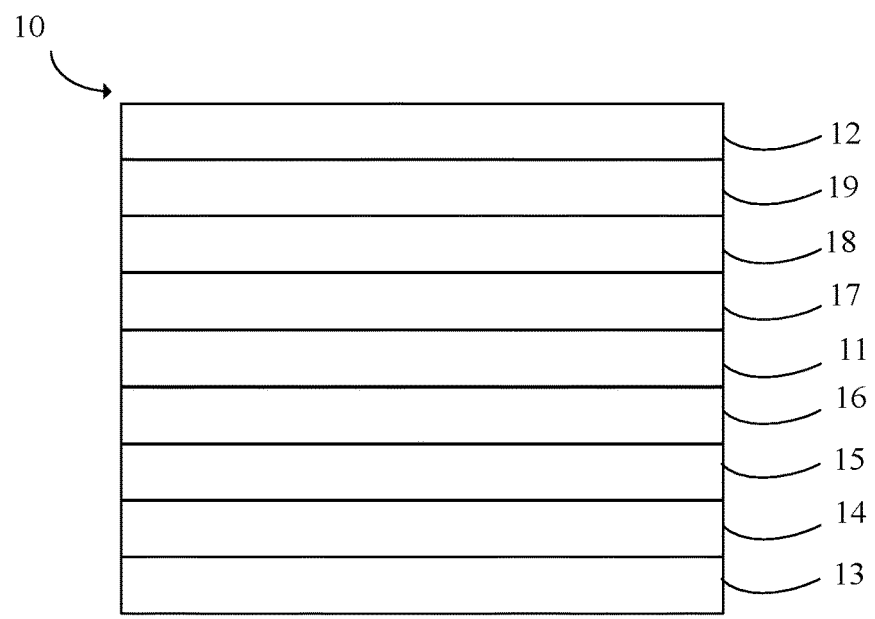
FIG. 7 is a schematic structural view of an organic light emitting display device according to an embodiment of the present invention.

Referring to FIG. 7, in an embodiment of the present invention, the organic light emitting display device 10 includes a first optically clear adhesive layer (first OCA layer) 14, a backplane 15, a second optical adhesive layer 16, the built-in touch display panel 11, a third optical adhesive layer 17, to cover plate 18, a base film 19, and the hard coating layer 12. The organic light emitting display device 10 of the embodiment includes the built-in touch display panel 11. The built-in touch display panel 11 is realized by, for example, a direct on TFE (DOT) technology or an incell touch panel (ITP) technology. DOT technology is an on-cell process. The touch sensor is directly implemented on the encapsulation layer (TFE) through a low-temperature process. No additional layer of external film is required, which directly reduces a number of layers and reduces the thickness thereof. Compared with the current organic light emitting display device, the organic light emitting display device 10 of the embodiment can reduce two layers of optical adhesive layers, and an overall surface hardness thereof is greatly improved.

Figure 8:
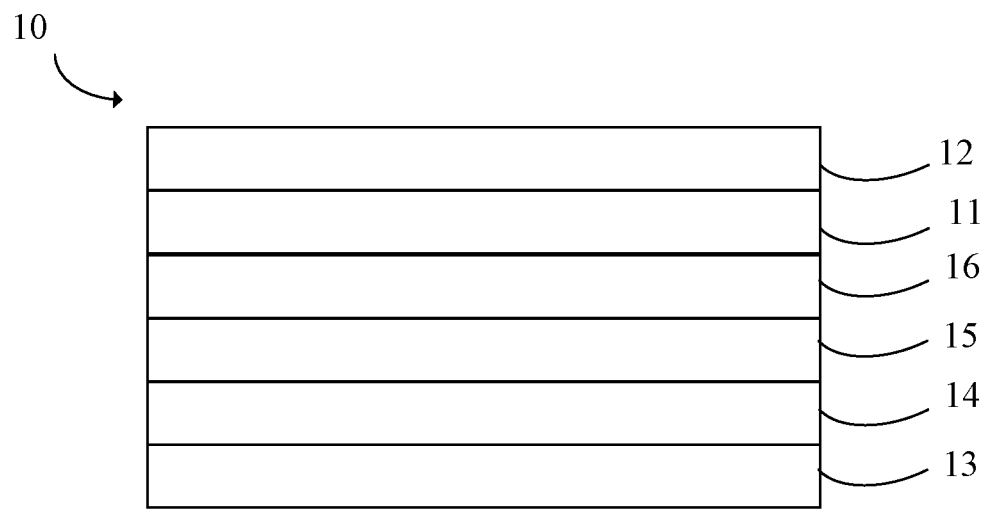
FIG. 8 is a schematic structural view of an organic light emitting display device according to an embodiment of the present invention.

Referring to FIG. 8, in an embodiment of the present invention, the organic light emitting display device 10 includes a foam layer 13, a first optical adhesive layer 14, a backplane 15, a second optical adhesive layer 16, the built-in touch display panel 11, and the hard coating layer 12. The organic light emitting display device 10 of the embodiment directly applies the hard coating layer 12 to the built-in touch display panel 11 having a built in polarization function and a built in touch function, that is, a TFE or a DOT is on the touch layer, the hardness of the entire surface of the organic light emitting display device 10 can be further improved.

Referring to FIG. 9 to FIG. 14, an embodiment of the present invention provides a method for fabricating an organic light emitting device 100, including the following steps.

Figure 9:
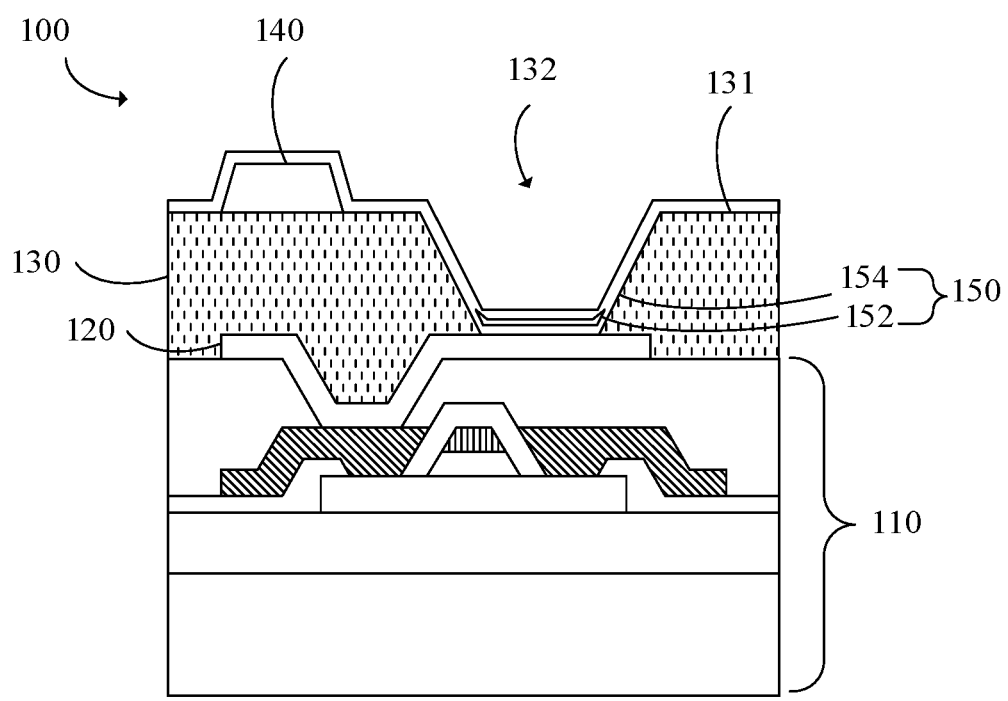
FIG. 9 is a flowchart illustrating a method of fabricating an organic light emitting device according to an embodiment of the present invention.

Referring to FIG. 9, step S1, a substrate layer 110 is provided.

Step S2, forming an anode 120 on the substrate layer 110 is provided.

Step S3, forming a pixel defining layer 130 on the anode 120 is provided. The pixel defining layer 130 includes bumps 131 and openings 132 spaced apart from each other. The openings 132 expose the anode 120.

Step S4, forming a light emitting functional layer 150 on the pixel defining layer 130 is provided.

Step S5, forming a polarizing layer on the light emitting functional layer 150 is provided and at least a part of the polarizing layer is disposed in the openings 132. In an embodiment of the present invention, the light emitting function layer 150 includes an organic light emitting layer 152 and a cathode 154 disposed on the anode 120. The cathode 154 covers the organic light emitting layer 152 and the bump 131 of the pixel defining layer 130, and the first inorganic layer 170 completely covers the cathode 154. The organic light emitting layer 1152 is, for example, a red light emitting layer, a green light emitting layer, or a blue light emitting layer that functions as a light emitting layer.

Figure 10:
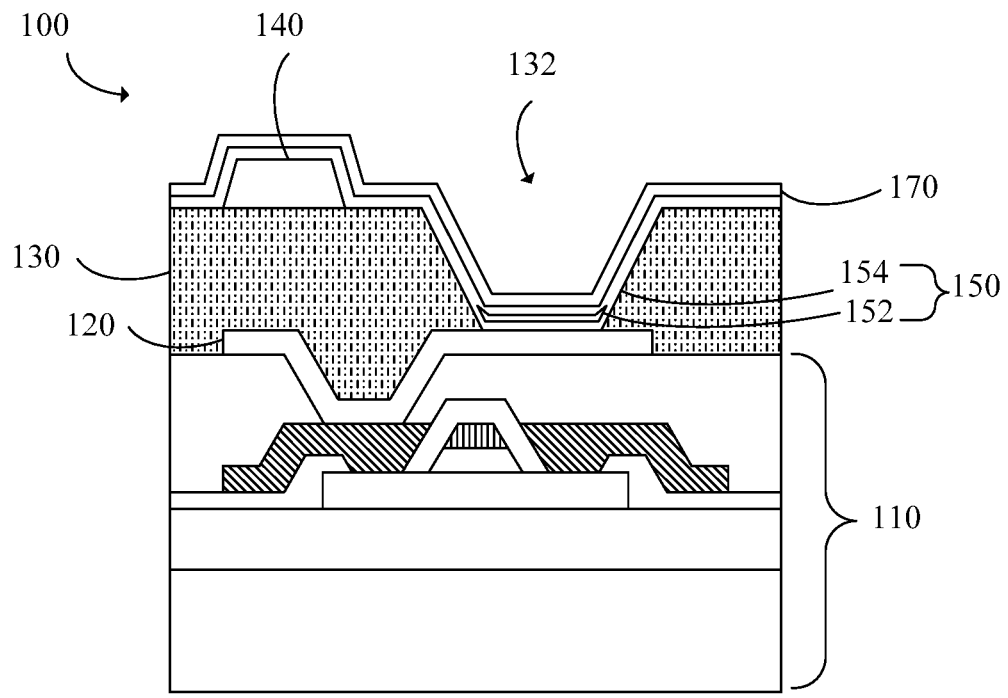
FIG. 10 is a schematic view illustrating a method of fabricating an organic light emitting device according to an embodiment of the present invention.

Referring to FIG. 10, step S6, a first inorganic layer 170 is provided.

Specifically, the first inorganic layer 170 is disposed on the light emitting function layer 150.

Figure 11:
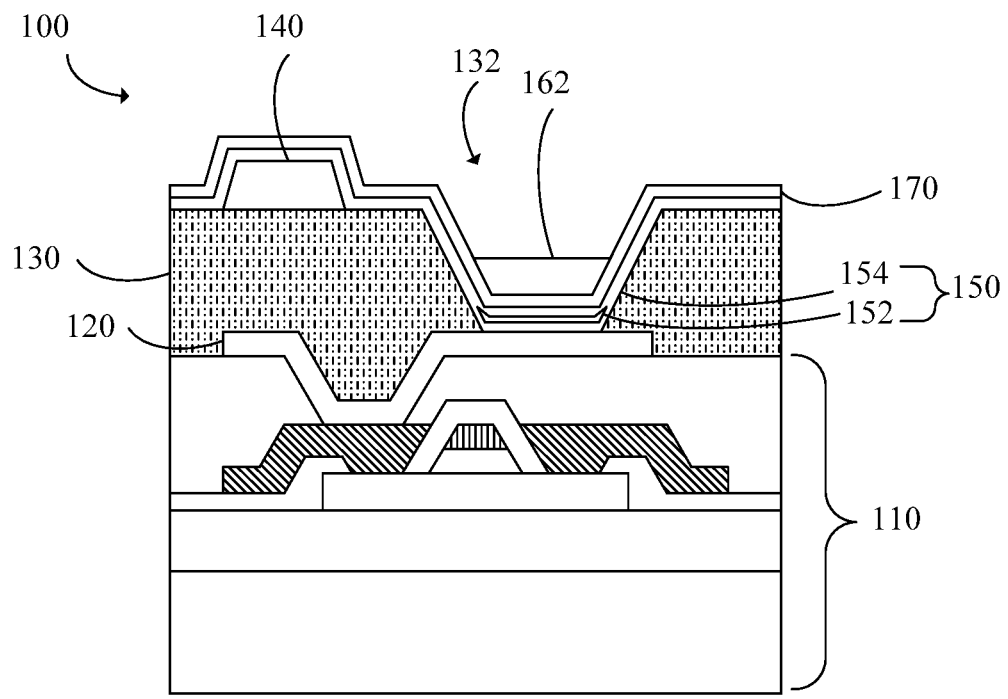
FIG. 11 is a schematic view illustrating a method of fabricating an organic light emitting device according to an embodiment of the present invention.

Referring to FIG. 11, step S7, a first polarizing layer 162 of the polarizing layer is provided.

Specifically, the first polarizing layer 162 is disposed on the first inorganic layer 170. The first polarizing layer 162 is a first light alignment liquid crystal layer. The thickness of the first polarizing layer 162 ranges between 0.3 μm and 3 μm. The first polarizing layer 162 is disposed within the openings 132.

Specifically, the first liquid crystal layer is injected into the inside of the pixel at a fixed point, and the thickness of the first liquid crystal layer ranges between 0.3 μm and 3 μm. The first liquid crystal layer is then subjected to photoalignment to form the first polarizing layer 162.

Figure 12:
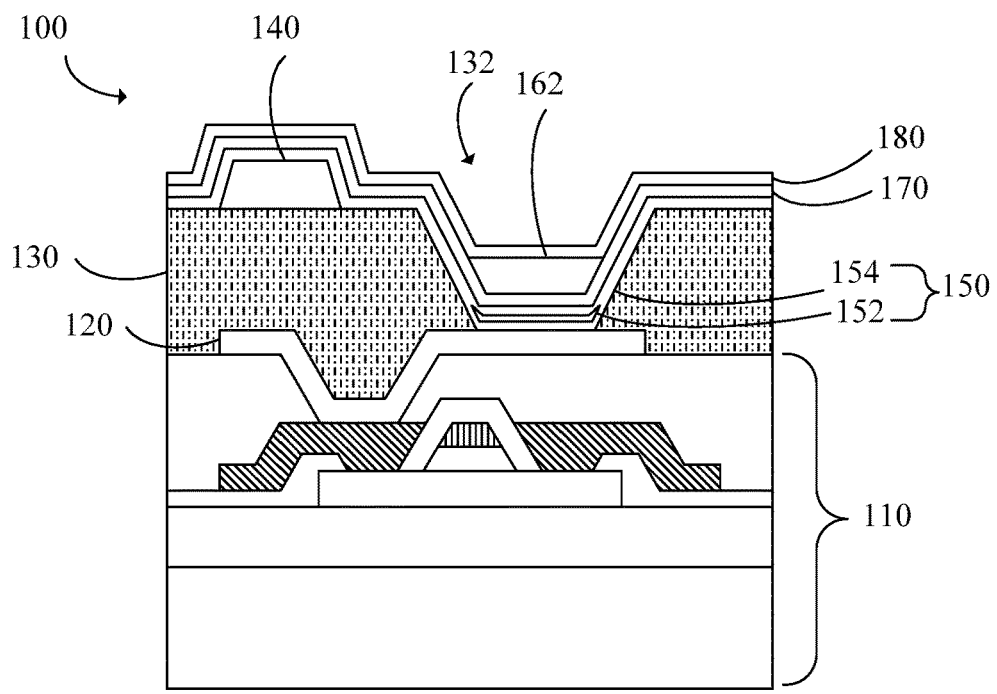
FIG. 12 is a schematic view illustrating a method of fabricating an organic light emitting device according to an embodiment of the present invention.

Referring to FIG. 12, step S8, a second inorganic layer 180 is provided.

Specifically, the second inorganic layer 180 is disposed on the first inorganic layer 170 and the first polarizing layer 162.

Figure 13:
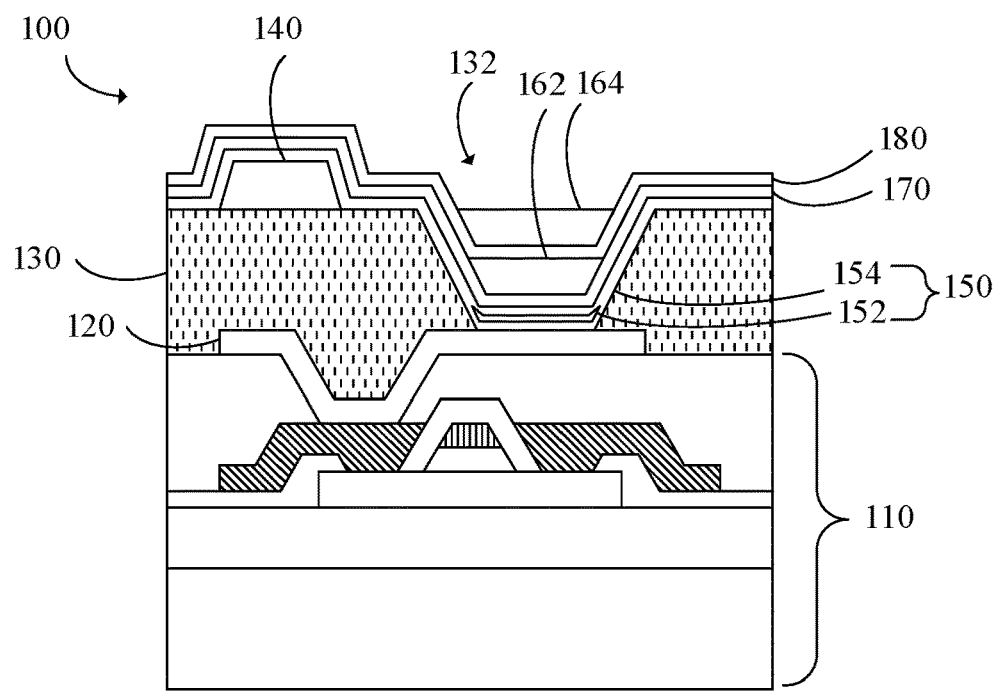
FIG. 13 is a schematic view illustrating a method of fabricating an organic light emitting device according to an embodiment of the present invention.

Referring to FIG. 13, step S9, a second polarizing layer 164 of the polarizing layer is provided.

Specifically, the second polarizing layer 164 is disposed on the second inorganic layer 180. The second polarizing layer 164 is a second light alignment liquid crystal layer including a dye. The thickness of the second polarizing layer 164 ranges between 0.3 μm and 3 μm.

Specifically, the second liquid crystal layer including the dye is injected into the inside of the pixel at a fixed point, and the thickness of the second liquid crystal layer ranges between 0.3 μm and 3 μm. The second liquid crystal layer is then subjected to photoalignment to form the second polarizing layer 164. The light alignment direction of the second liquid crystal layer is different from the light alignment direction of the first liquid crystal layer, and the second liquid crystal layer needs to have a function of a line deviation layer.

Figure 14:
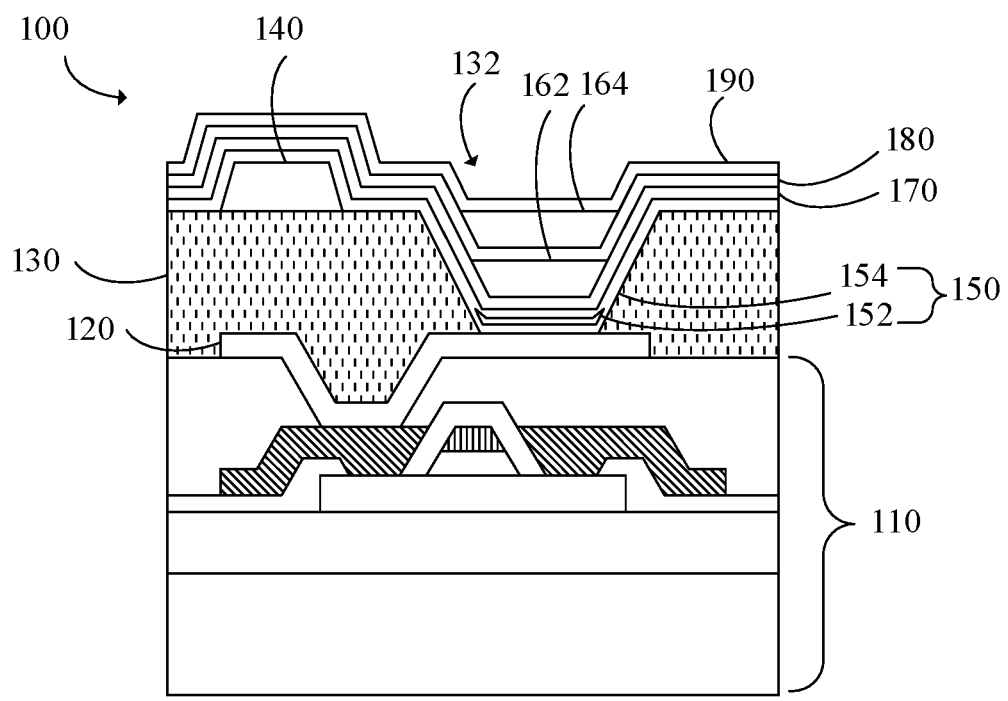
FIG. 14 is a schematic view illustrating a method of fabricating an organic light emitting device according to an embodiment of the present invention.

Referring to FIG. 14, step S10, an encapsulation layer 190 is provided.

Specifically, the encapsulation layer 190 is formed on the polarizing layer. The encapsulation layer 190 is used to encapsulate the polarizing layer and the light emitting functional layer 152.

Embodiments of the present invention provide an organic light emitting device, a method of fabricating the same, and an organic light emitting display device. The polarizing layer in the embodiment of the present disclosure is disposed on the light emitting functional layer, and the encapsulating layer is disposed on the polarizing layer for encapsulating the polarizing layer and the light emitting functional layer to implement built-in polarization function of the organic light emitting device, reduce the thickness of the organic light emitting device, and facilitate bending of the organic light emitting device.

Although the present disclosure is described via one or more embodiments, those of ordinary skill in the art can come up with equivalent variations and modifications based upon the understanding of the specification and the accompanying drawings. The present disclosure includes all such modifications and variations and is only limited by the scope of the appended claims. In particular, as to the various functions performed by the components described above, the terms used to describe the components are intended to correspond to any component performing the specific functions (e.g., which are functionally equivalent) of the components (unless otherwise indicated), even those which are structurally different from the disclosed structure for performing the functions in the exemplary embodiments in the specification shown herein. In addition, although a particular feature in the specification is disclosed in only one of many embodiments, this feature may be combined with one or more features in other embodiments which are desirable and advantageous to a given or particular application. Moreover, the terms "include", "have", "consist of", or variations thereof used in the detailed description or the claims are intended to be used in a manner similar to the term "comprising".

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

What is claimed is:

1. An organic light emitting device, comprising:
   a substrate layer;
   an anode disposed on the substrate layer;
   a pixel defining layer disposed on the anode and comprising bumps and openings spaced apart from each other, the openings exposing the anode;
   a light emitting functional layer disposed on the pixel defining layer;
   a polarizing layer disposed on the light emitting functional layer, wherein at least a portion of the polarizing layer is disposed within the openings; and
   an encapsulation layer disposed on the polarizing layer for encapsulating the polarizing layer and the light emitting functional layer;
   wherein the polarizing layer comprises a first inorganic layer, a first polarizing layer, a second inorganic layer, and a second polarizing layer, which are sequentially disposed, the first inorganic layer is disposed on the light emitting functional layer and the pixel defining layer, and the first polarizing layer and the second polarizing layer are disposed corresponding to the openings.

2. The organic light emitting device according to claim 1, wherein the first polarizing layer is disposed in the openings, and the second inorganic layer is coated on the first polarizing layer and the first inorganic layer.

3. The organic light emitting device according to claim 2, wherein the first polarizing layer is a circularly polarizing layer, and the second polarizing layer is a linearly polarizing layer.

4. The organic light emitting device according to claim 3, wherein the first polarizing layer and the second polarizing layer have shapes of an inverted trapezoid having an upper width and a lower width, or the shape of the first polarizing layer is the inverted trapezoid having the upper width and the lower width, and the shape of the second polarizing layer is a polygon having an upper width and a lower width.

5. The organic light emitting device according to claim 3, wherein the first polarizing layer is a first light alignment liquid crystal layer, and the second polarizing layer is a second light alignment liquid crystal layer comprising a dye.

6. The organic light emitting device according to claim 1, wherein the light emitting functional layer comprises an organic light emitting layer and a cathode disposed on the anode, the cathode is coated on the organic light emitting layer and the bumps of the pixel defining layer, and the first inorganic layer completely covers the cathode.

7. The organic light emitting device according to claim 1, further comprising spacers disposed on the bumps, wherein the first inorganic layer is disposed on the spacers.

8. The organic light emitting device according to claim 7, wherein a sum of a thickness of the pixel defining layer and a thickness of each of the spacers is greater than or equal to a sum of a thickness of the anode, a thickness of the light emitting functional layer, a thickness of the first polarizing layer, and a thickness of the second polarizing layer.

9. The organic light emitting device according to claim 7, wherein an inner angle of a bottom edge of each of the spacers is less than or equal to an inner angle of a bottom edge of the pixel defining layer.

10. The organic light emitting device according to claim 1, wherein a projection of the first polarizing layer on the anode and a projection of the second polarizing layer on the anode partially coincide.

11. An organic light emitting display device, comprising:
an organic light emitting device; and
a cover plate disposed on the organic light emitting device, the organic light emitting device comprising:
a substrate layer;
an anode disposed on the substrate layer;
a pixel defining layer disposed on the anode and comprising bumps and openings spaced apart from each other, the openings exposing the anode;
a light emitting functional layer disposed on the pixel defining layer;
a polarizing layer disposed on the light emitting functional layer, wherein at least a portion of the polarizing layer is disposed within the openings; and
an encapsulation layer disposed on the polarizing layer for encapsulating the polarizing layer and the light emitting functional layer;
wherein the polarizing layer comprises a first inorganic layer, a first polarizing layer, a second inorganic layer, and a second polarizing layer, which are sequentially disposed, the first inorganic layer is disposed on the light emitting functional layer and the pixel defining layer, and the first polarizing layer and the second polarizing layer are disposed corresponding to the openings.

12. The organic light emitting display device according to claim 11, wherein the first polarizing layer is disposed in the openings, and the second inorganic layer is coated on the first polarizing layer and the first inorganic layer.

13. The organic light emitting display device according to claim 12, wherein the first polarizing layer is a circularly polarizing layer, and the second polarizing layer is a linearly polarizing layer.

14. The organic light emitting display device according to claim 13, wherein the first polarizing layer and the second polarizing layer have shapes of an inverted trapezoid having an upper width and a lower width, or the shape of the first polarizing layer is the inverted trapezoid having the upper width and the lower width, and the shape of the second polarizing layer is a polygon having an upper width and a lower width.

15. The organic light emitting display device according to claim 11, wherein the light emitting functional layer comprises an organic light emitting layer and a cathode disposed on the anode, the cathode is coated on the organic light emitting layer and the bumps of the pixel defining layer, and the first inorganic layer completely covers the cathode.

16. The organic light emitting display device according to claim 11, wherein the organic light emitting device further comprises spacers disposed on the bumps, and the first inorganic layer is disposed on the spacers.

17. The organic light emitting display device according to claim 16, wherein a sum of a thickness of the pixel defining layer and a thickness of each of the spacers is greater than or equal to a sum of a thickness of the anode, a thickness of the light emitting functional layer, a thickness of the first polarizing layer, and a thickness of the second polarizing layer.

18. The organic light emitting display device according to claim 11, wherein a projection of the first polarizing layer on the anode and a projection of the second polarizing layer on the anode partially coincide.

* * * * *